United States Patent
Tung et al.

(10) Patent No.: US 9,721,746 B2
(45) Date of Patent: Aug. 1, 2017

(54) DISPLAY DEVICE AND METHOD FOR MANUFACTURING THE SAME

(71) Applicant: G-TECH Optoelectronics Corporation, Miaoli County (TW)

(72) Inventors: Li-Ting Tung, New Taipei (TW); Yu-Chen Liu, New Taipei (TW); Ping-Chun Liang, New Taipei (TW)

(73) Assignee: G-TECH Optoelectronics Corporation, Miaoli County (TW)

( * ) Notice: Subject to any disclaimer, the term of this patent is extended or adjusted under 35 U.S.C. 154(b) by 60 days.

(21) Appl. No.: 14/481,516

(22) Filed: Sep. 9, 2014

(65) Prior Publication Data

US 2015/0103270 A1    Apr. 16, 2015

(30) Foreign Application Priority Data

Oct. 15, 2013   (TW) ................ 102137080 A

(51) Int. Cl.
| | |
|---|---|
| *G02F 1/1333* | (2006.01) |
| *H01J 17/49* | (2012.01) |
| *H01L 51/00* | (2006.01) |
| *H01L 51/52* | (2006.01) |
| *H01J 11/34* | (2012.01) |
| *G02F 1/1335* | (2006.01) |
| *G06F 3/041* | (2006.01) |

(52) U.S. Cl.
CPC ........... *H01J 17/49* (2013.01); *G02F 1/1333* (2013.01); *H01J 11/34* (2013.01); *H01L 51/0097* (2013.01); *H01L 51/524* (2013.01); *G02F 1/13338* (2013.01); *G02F 1/133514* (2013.01); *G02F 1/133608* (2013.01); *G02F 2201/50* (2013.01); *G02F 2201/56* (2013.01); *G06F 3/041* (2013.01); *H01L 2251/5338* (2013.01); *Y02E 10/549* (2013.01); *Y02P 70/521* (2015.11)

(58) Field of Classification Search
CPC ............ G02F 1/1339; G02F 1/133514; G02F 1/13338; G02F 1/1333; G02F 1/133608; G02F 2201/50; G02F 2201/56; G02F 3/041; H01J 17/49; H01J 11/34; H01L 51/0097; H01L 51/524; H01L 2251/5338; Y02E 10/549; Y02P 70/521
USPC ........................................................ 349/158
See application file for complete search history.

(56) References Cited

U.S. PATENT DOCUMENTS

| | | | | |
|---|---|---|---|---|
| 4,127,321 | A * | 11/1978 | Koyama | ............... G02F 1/1345 257/727 |
| 8,657,456 | B2 * | 2/2014 | Yamagata | ................ G09F 9/35 349/58 |
| 2003/0155861 | A1 * | 8/2003 | Nishizawa | .......... H01L 51/5246 313/512 |

(Continued)

FOREIGN PATENT DOCUMENTS

| | | |
|---|---|---|
| CN | 1612185 A | 5/2005 |
| CN | 101430440 A | 5/2009 |

(Continued)

*Primary Examiner* — Charles Chang
(74) *Attorney, Agent, or Firm* — Steven Reiss

(57) ABSTRACT

Display device includes a display panel. The display panel includes a first substrate, a sealant, and, a second substrate fastended to the first substrate via the sealant. At least one of the first substrate and the second substrate is a non-planar substrate including at least two portions correspondingly extending in different planes.

13 Claims, 6 Drawing Sheets

(56) References Cited

U.S. PATENT DOCUMENTS

| | | | | |
|---|---|---|---|---|
| 2009/0102369 A1* | 4/2009 | Nakanishi | G02F 1/1345 | 313/504 |
| 2009/0201438 A1* | 8/2009 | Kim | H01L 27/3276 | 349/58 |
| 2010/0073593 A1* | 3/2010 | Sasaki | B29D 11/00 | 349/58 |
| 2011/0019351 A1* | 1/2011 | Bayne | G02F 1/133308 | 361/679.01 |
| 2011/0068492 A1* | 3/2011 | Chen | G02F 1/1303 | 264/1.7 |
| 2011/0228190 A1* | 9/2011 | Yang | G02F 1/13394 | 349/56 |
| 2011/0285934 A1* | 11/2011 | Watanabe | G02F 1/133526 | 349/58 |
| 2013/0201436 A1* | 8/2013 | Choi | G02F 1/133526 | 349/193 |
| 2013/0321740 A1* | 12/2013 | An | H05K 5/0217 | 349/58 |
| 2014/0092356 A1* | 4/2014 | Ahn | G02F 1/1339 | 349/153 |
| 2014/0176856 A1* | 6/2014 | Lee | G02F 1/133305 | 349/61 |

FOREIGN PATENT DOCUMENTS

| | | |
|---|---|---|
| CN | 102740623 A | 10/2012 |
| JP | 2001154592 A | 6/2001 |
| JP | 2008243386 A | 10/2008 |
| TW | 200823539 A | 6/2008 |

\* cited by examiner

DISPLAY DEVICE AND METHOD FOR MANUFACTURING THE SAME

FIELD

The disclosure generally relates to display technologies, and particularly to a display device with at least one non-planar substrate and a method for manufacturing the same.

BACKGROUND

A display device usually includes a pair of flat substrates and a liquid crystal layer set between the pair of substrates. However, appearance design of the display device is restricted by the flat substrates. Furthermore, a display region of the display device is also restricted to the flat substrates.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one."

Figure 1:
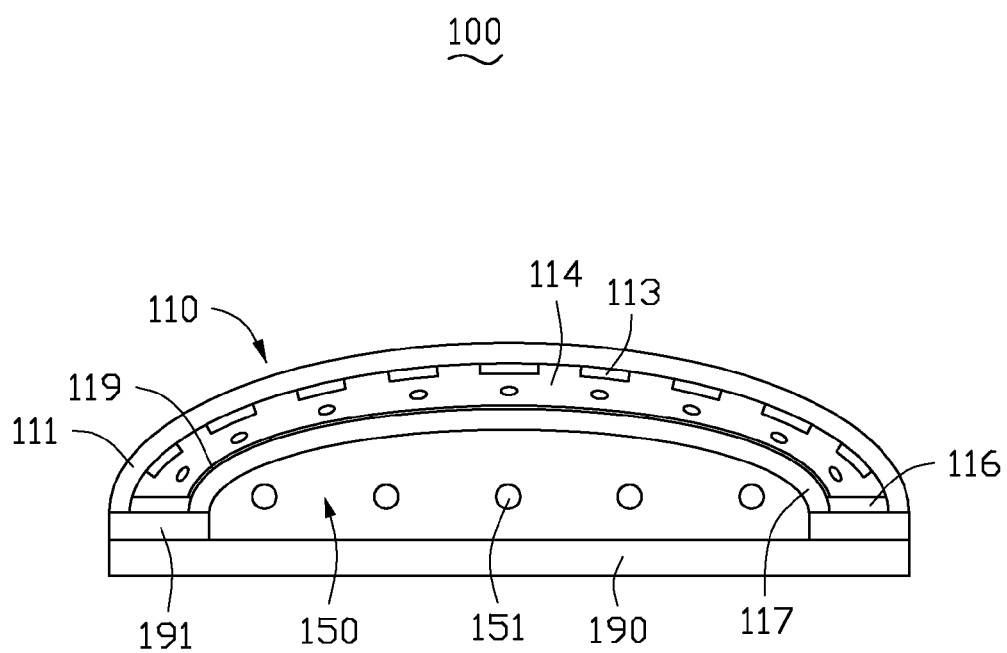
FIG. 1 is an side elevation view of a first embodiment of a display device.

FIG. 1 shows a display device 100 of a first embodiment. The display device 100 includes a display panel 110, a backlight module 151, and a back cover 190. The back cover 190 is fastened to a bottom of the display panel 110 by adhesive 191. The back cover 190 and the display panel 110 cooperatively defines a receiving space 150 therebetween to accommodate the backlight module 151. The backlight module 151 provides a backlight to the display panel 110. The backlight is modulated by the display panel 110 to display an image.

In this embodiment, the display panel 110 can be a liquid crystal display panel, such as a twisted nematic liquid crystal display panel (TN-LCD panel), a super twisted nematic liquid crystal panel (STN-LCD panel), and a thin film transistor liquid crystal display panel (TFT-LCD panel). The backlight module 151 can be, but is not limited to, a number of parallel cold cathode fluorescent lamps (CCFL) or a number of light emitting devices (LED).

The display panel 110 includes a first substrate 111, a second substrate 117, a liquid crystal layer 114, and a sealant 116. The first substrate 111 is fastened to the second substrate 117 via the sealant 116. The liquid crystal layer 114 is sealed between the first substrate 111 and the second substrate 117 by the sealant 116. At least one of the first substrate 111 and the second substrate 117 is a non-planar substrate which includes at least two portions correspondingly extending in different planes. Curvature of a surface of the first substrate 111 or the second substrate 117 can be zero or non-zero. The non-zero curvature of the surface of the first substrate 111 or the second substrate 117 may be constant or continuously variational. The continuously variational curvatures of the surface of the first substrate 111 or the second substrate 117 may be linear or non-linear.

In this embodiment, the curvature of the first substrate 111 is continuously variable. The second substrate 117 is shaped similarly to the first substrate 111 and parallel to the first substrate 111. The first substrate 111 is a color filter substrate and includes a number of color filters 113 arranged as a matrix to correspondingly define a number of pixel units. The second substrate 117 is a thin film transistor substrate and includes a number of thin film transistors 119 corresponding to the pixel units.

The first substrate 111 and the second substrate 117 may be, but are not limited to, physically toughened glass, chemically toughened glass, or regular glass. A material of the first substrate 111 or the second substrate 117 is selected from a group consisting of soda-lime glass, aluminium silicate glass, alkali-free glass, and borosilicate glass.

The back cover 190 may be, but is not limited to, a glass board, a plastic board, or a metal board. In this embodiment, the back cover 190 is a plastic board which is made of a material selected from a group consisting of polyethylene naphthalate (PEN), polyethylene terephthalate (PET), Polyether Sulfone (PES), and polyimide (PI).

Because at least one of the substrates of the display panel 110 is a non-planar substrate, the appearance design of the display device 100 becomes variable. The display device 110 not only can display the image on a front flat surface but also on a side curved surface, which makes the display device 100 more attractive.

Figure 2:
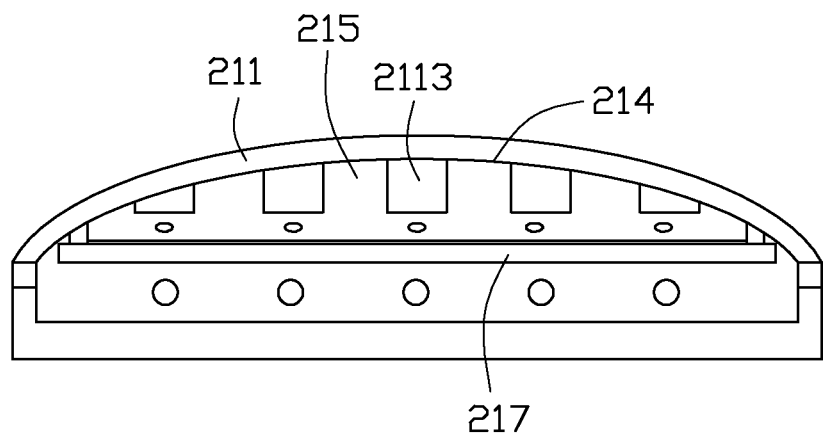
FIG. 2 is an side elevation view of a second embodiment of a display device.

FIG. 2 shows a second embodiment of a display device 200, which is similar to the display device 100 of the first embodiment, except that the second substrate 217 is a flat substrate. Two opposite sides of the second substrate 217 are fastened to a lower surface 214 of the first substrate 211 to seal the liquid crystal layer 215 between the first substrate 211 and the second substrate 217. Thicknesses of the color filters 2113 gradually increase from opposite peripheries of the first substrate 211 to a center of the first substrate 211 in order to keep a consistent thickness of the liquid crystal layer 215.

Figure 3:
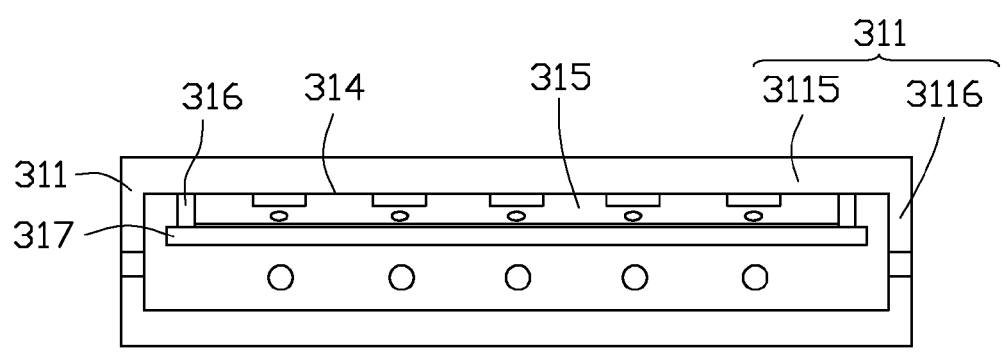
FIG. 3 is an side elevation view of a third embodiment of a display device.

FIG. 3 shows a third embodiment of a display device 300, which is similar to the display device 100 of the first embodiment, except that the first substrate 311 includes a central portion 3115 and a side portion 3116 extending from a periphery of the central portion 3115. The central portion 3115 is flat and comprises a lower surface 314 and an upper surface opposite to the lower surface 314. Both the lower surface 314 and an upper surface are planar surfaces. The side portion 3116 is perpendicular to the lower surface 314 of the central portion 3115. The second substrate 317 is flat. Two opposite sides of the second substrate 317 are fastened to a lower surface 314 of the first substrate 311 to seal the liquid crystal layer 315 via a sealant 316.

Figure 4:
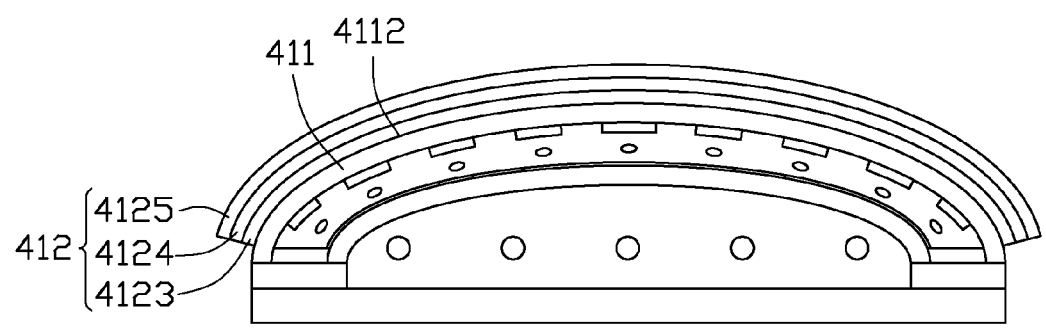
FIG. 4 is an side elevation view of a fourth embodiment of a display device.

FIG. 4 shows a fourth embodiment of a display device 400, which is similar to the display device 100 of the first embodiment, except that the display device 400 of the fourth embodiment further includes a touch module 412 formed on an upper surface 4112 of the first substrate 411. The touch module 412 includes a first touch sensing film 4123, a second touch sensing film 4124, and a protection film 4125. The first touch sensing film 4123 is directly attached to the upper surface 4112 of the first substrate 411 for generating a touch sensing signal transmitted along a first direction. The second touch sensing film 4124 is stacked on the first touch sensing film 4123 for generating a touch sensing signal transmitted along a second direction. The protection film 4125 is stacked on the second touch sensing film 4124 for protecting the first touch sensing film 4123 and the second touch sensing film 4124.

Figure 5:
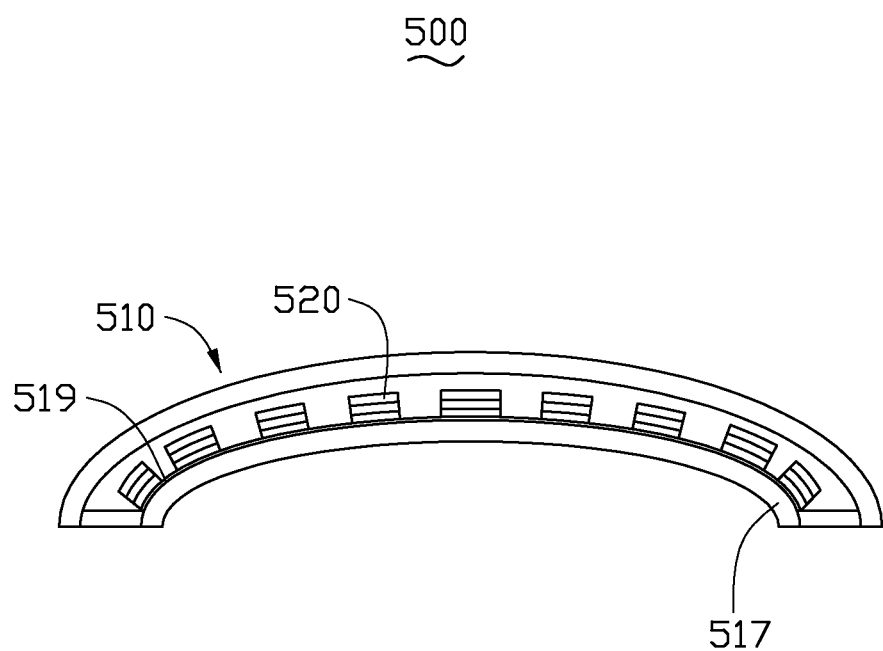
FIG. 5 is an side elevation view of a fifth embodiment of a display device.

FIG. 5 is a fifth embodiment of a display device 500, which is similar to the display device 100 of the first embodiment, except that the display panel 510 is an organic light emitting diode display panel without the liquid crystal layer 114 and the backlight module 151. The display panel 510 includes a number of organic light emitting diodes 520 formed on the second substrate 517. The organic light emitting diodes 520 are correspondingly driven by the thin film transistors 519 on the second substrate 517 to display the image. Because there is no backlight module 151, the back cover 190 also can be omitted in the display device 500 of the fifth embodiment, and thus the thickness of the display device 500 is significantly reduced.

In the other alternative embodiment, the display panel 500 may be, but is not limited to, an inorganic electro-luminescence display panel or a plasma display panel.

Figure 6:
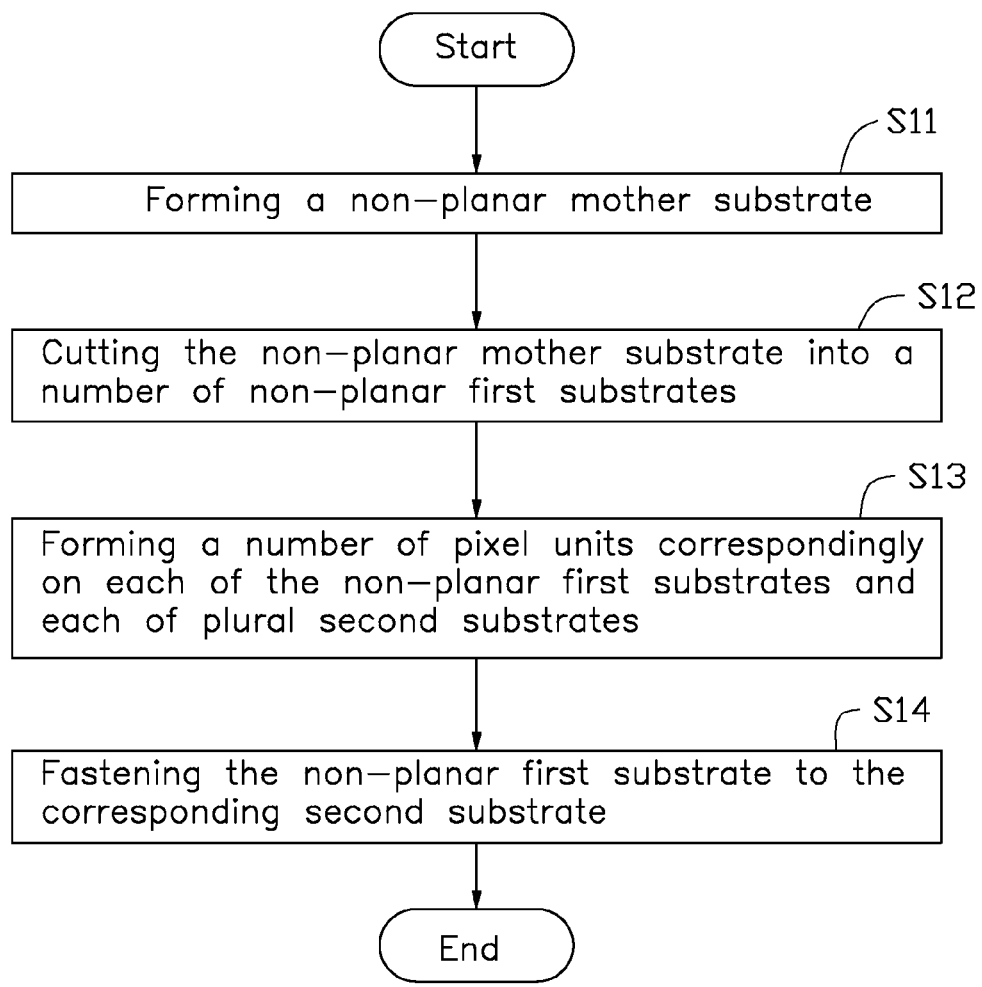
FIG. 6 is a flowchart of an exemplary embodiment of a manufacturing method of a display device.

FIG. 6 is a flowchart of an exemplary embodiment of a manufacturing method of the display device mentioned above. Depending on the embodiment, additional steps may be added, others deleted, and the ordering of the steps may be changed.

In step S11, a non-planar mother substrate is formed.

In step S12, the mother substrate is cut into a number of non-planar first substrates.

In step S13, a number of pixel units are correspondingly formed on each of the non-planar first substrates and each of plural second substrates. The pixel unit is a basic unit for displaying a pixel of the image. The pixel units may be, but are not limited to, a color filters array, a thin film transistors array, or an organic light emitting diodes array.

In step S14, the non-planar first substrate is fastened to the corresponding second substrate.

It is understood that, if the display panel of the display device is a liquid crystal panel. The manufacturing method further includes a step of injecting liquid crystal layer into a space between the non-planar first substrate and the second substrate after the step S14.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments.

What is claimed is:

1. A display device, comprising:
a display panel comprising:
a first substrate;
a sealant; and
a second substrate fastened to the first substrate via the sealant;
wherein the first substrate comprises a central portion and a side portion extending from a periphery of the central portion; the central portion is flat and comprises a lower surface and an upper surface opposite to the lower surface, both the lower surface and the top surface are planar surfaces; the side portion is perpendicular to the lower surface; the second substrate is flat, and two opposite sides of the second substrate are fastened to the lower surface of the central portion through the sealant.

2. The display device of claim 1, wherein the display panel is a liquid crystal display panel, the first substrate is a color filter substrate comprising a plurality of color filters arranged as a matrix, the second substrate is a thin film transistor substrate comprising a plurality of thin film transistors corresponding to the color filters, and the display panel further comprises a liquid crystal layer sealed between the first substrate and the second substrate.

3. The display device of claim 1, wherein further comprising:
a back cover fastened to a bottom of the side portion via an adhesive; and
a backlight module accommodated between a receiving space defined between the display panel and the back cover.

4. The display device of claim 3, wherein the back cover is selected from a group consisting of a glass board, a plastic board, and a metal board.

5. The display device of claim 3, wherein the back cover is made of a material selected from a group consisting of polyethylene naphthalate, polyethylene terephthalate, polyether sulfone, and polyimide.

6. The display device of claim 2, further comprising a touch module formed on an upper surface of the first substrate, the touch module comprising:
a first touch sensing film directly attached to the upper surface of the first substrate;
a second touch sensing film stacked on the first touch sensing film; and
a protection film stacked on the second touch sensing film.

7. The display device of claim 1, wherein the first substrate and the second substrate are selected from a group consisting of physical toughened glasses, chemical toughened glasses, and regular glasses without being toughened.

8. The display device of claim 1, wherein a material of the first substrate or the second substrate is selected from a group consisting of soda-lime glasses, aluminium silicate glasses, alkali-free glasses, and borosilicate glasses.

9. The display device of claim 1, wherein the display panel is an organic light emitting diode display panel and comprises a plurality of organic light emitting diodes formed on the second substrate, the second substrate is a thin film transistor substrate comprising a plurality of thin film transistors, and the organic light emitting diodes are correspondingly driven by the thin film transistors on the second substrate to display the image.

10. The display device of claim 1, wherein the display panel is an inorganic electro-luminescence display panel.

11. The display device of claim 1, wherein the display panel is a plasma display panel.

12. A manufacturing method of a display device, the method comprising:
forming a non-planar mother substrate;
cutting the non-planar mother substrate into a number of non-planar first substrates, wherein each of the non-planar first substrates comprises a central portion and a side portion extending from a periphery of the central portion; the central portion is flat and comprises a lower surface and a upper surface opposite to the lower surface, both the lower surface and the top surface are flat surfaces; the side portion is perpendicular to the lower surface;

forming a number of pixel units correspondingly on each of the non-planar first substrates;

forming a number of second substrates, each of the second substrates being flat; and fastening two opposite sides of the corresponding second substrate to the lower surface of the central portion via a sealant.

13. The manufacturing method of claim 12, wherein the display device is a liquid crystal display device, and further comprises a step of injecting a liquid crystal layer into a space between the non-planar first substrate and the second substrate after the non-planar first substrate is fastened to the second substrate.

* * * * *